United States Patent [19]

Hislop

[11] 4,286,229

[45] Aug. 25, 1981

[54] WAVEGUIDE STRUCTURE FOR SELECTIVELY COUPLING MULTIPLE FREQUENCY OSCILLATORS TO AN OUTPUT PORT

[75] Inventor: Alfred R. Hislop, San Diego, Calif.

[73] Assignee: The United States of America as represented by the Secretary of the Navy, Washington, D.C.

[21] Appl. No.: 97,454

[22] Filed: Nov. 26, 1979

[51] Int. Cl.³ .............................................. H03B 9/14
[52] U.S. Cl. ....................................... 331/49; 331/56; 331/107 DP
[58] Field of Search ....................... 331/46, 49, 56, 96, 331/107 DP, 107 P, 107 G, 102, 107 T

[56] References Cited

U.S. PATENT DOCUMENTS 3,160,826  12/1964  Marcatili ...................... 331/107 T X
3,254,309  5/1966  Miller ................................. 331/96 X
3,628,171  12/1971  Kurokawa et al. .......... 331/107 P X

FOREIGN PATENT DOCUMENTS 2015842  9/1979  United Kingdom ................. 331/107 P Primary Examiner—Siegfried H. Grimm
Attorney, Agent, or Firm—Richard S. Sciascia; Ervin F. Johnston; Harvey Fendelman

[57] ABSTRACT

A device for connecting plural oscillators to a single output port without the use of power dividers, switches or multiplexing filters. The plural oscillators produce multiple frequencies with only one oscillator operating at a given time. The oscillators are mounted in shunt waveguide cavities along a central waveguide manifold at distances from the central waveguide manifold and waveguide end so as not to affect the operating oscillator.

7 Claims, 2 Drawing Figures

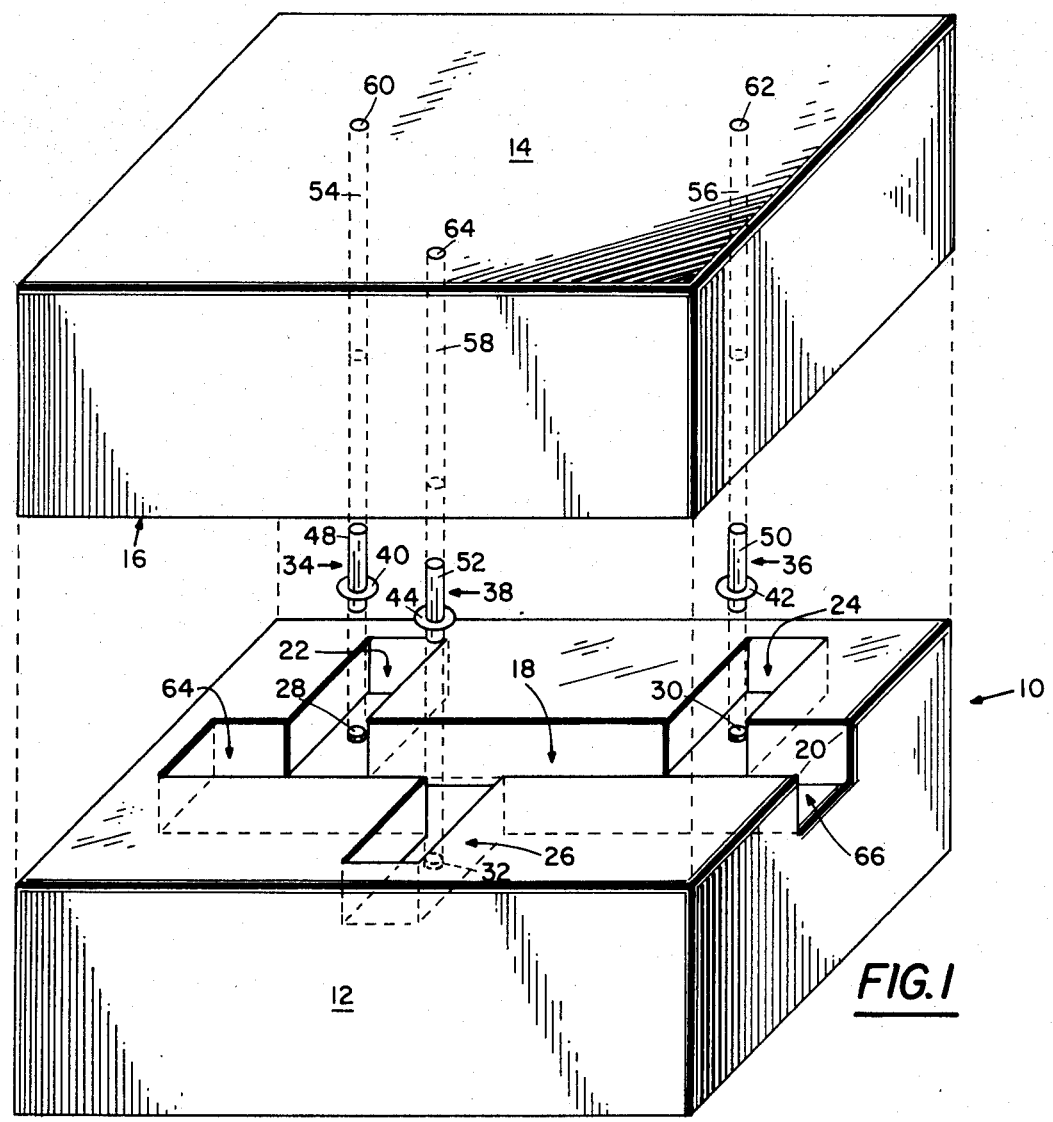
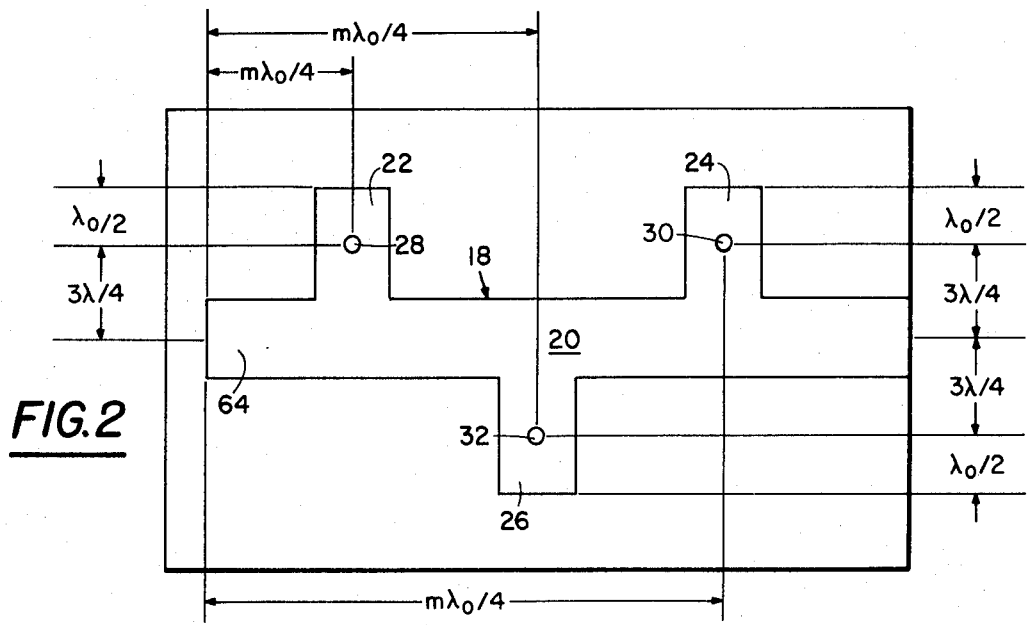

4,286,229

WAVEGUIDE STRUCTURE FOR SELECTIVELY COUPLING MULTIPLE FREQUENCY OSCILLATORS TO AN OUTPUT PORT

BACKGROUND OF THE INVENTION

The present invention relates generally to the field of oscillators and more particularly to the field of oscillators that have the capability of producing outputs at multiple frequencies and to oscillators that produce outputs at widely separated frequencies.

Many microwave systems such as wideband receivers require oscillators which provide power at several widely separated frequencies. When these frequencies are separated by more than the tuning range of a single oscillator then several oscillators must be used and a means must be provided for connecting these oscillators to a single output port. In the past this has been accomplished through the use of switches, power dividers and multiplexers. Use of these devices increases the size and complexity of the system and frequently produces undesirable electrical characteristics. Mechanical switches have the disadvantage that they limit the maximum speed with which frequencies can be changed and solid state switches do not have adequate bandwidth, particularly at millimeter wave frequencies. Power dividers introduce undesirable power loss and require the use of oscillators with greater output in order to overcome these losses.

SUMMARY OF THE INVENTION

Accordingly, there is disclosed herein a device for connecting several oscillators to a single output port without the use of power dividers, switches or multiplexers. There is thereby provided an oscillator structure that has the capability of producing multiple frequencies with only one oscillator operating at a given time and wherein the frequencies may be widely separated frequencies. The multiple oscillator device disclosed herein is constructed by shunt mounting the plural oscillators along a central waveguide manifold. The individual oscillators appear nearly as short circuits in the plane of each oscillator when no d.c. power is applied to the oscillators. Each oscillator which is preferably implemented as a Gunn diode oscillator is placed three-quarters of a wavelength from the waveguide manifold so that its shunt impedance appears as an open circuit at the manifold. The wavelength used for this calculation is determined by taking the average value of the center frequency of all the oscillators utilized. This allows the placement of several oscillators along the manifold without producing impedance discontinuities along the manifold. The present device thus allows very fast switching of oscillators by switching the d.c. bias of each oscillator and also reduces the size, cost and complexity of the system utilizing the multiple frequency oscillator of the present invention.

OBJECTS OF THE INVENTION

Accordingly, it is the primary object of the present invention to disclose a multiple frequency oscillator that has the capability of switching between these frequencies or bands of frequencies without the use of power dividers, switches or multiplexers.

Another object of the present invention is to disclose a multiple frequency oscillator that has the capability of switching between widely separated frequencies or bands of frequencies without the use of power dividers, switches or multiplexers.

A concomitant object of the present invention is to disclose a multiple frequency oscillator having reduced size, cost and complexity over previously available multiple frequency oscillators.

Other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1 is an isometric exploded view of the multiple frequency oscillator of the present invention.

FIG. 2 is a top view of member 12 of the multiple frequency oscillator of the present invention.

DESCRIPTION OF THE PREFERRED EMBODIMENT

Referring now to FIG. 1 the embodiment of the present invention illustrated therein will now be described. As seen in FIG. 1 the multiple frequency oscillator 10 of the present invention is implemented in waveguide, although it is to be understood that the present invention may be implemented in many transmission line forms including, but not limited to, coaxial, stripline, microstrip and coplanar waveguide. The waveguide implementation illustrated in FIG. 1 is comprised of a bottom waveguide housing member 12 and a top waveguide cap member 14. The bottom surface 16 of the waveguide top section 14 forms the top broad wall of the waveguide cavity 18 formed in the waveguide bottom member 12. As is seen more clearly in the top view of FIG. 2 the waveguide cavity 18 is divided into a central waveguide manifold 20 and three shunt waveguide cavities 22, 24 and 26 orthogonally disposed along the main waveguide manifold 20 as illustrated. It is to be understood that, although the embodiment of the present invention illustrated in FIGS. 1 and 2 includes three shunt cavities for accommodating three separate oscillators, the present invention could include two oscillators or more than three oscillators.

Mounted within each shunt waveguide cavity 22, 24 and 26 is an oscillator 28, 30 and 32, respectively. In the preferred embodiment these oscillators 28, 30 and 32 are Gunn diode oscillators which are screwed into the waveguide bottom member 12 and grounded thereto as is well known. It is to be understood, however, that although in the preferred embodiment Gunn diode oscillators are illustrated and described, other types of oscillators including IMPATT diode oscillators and any other oscillator that appears as a highly reactive impedance when not turned on may be utilized in the present invention. Referring again to FIG. 1 it is seen that there is also provided a Gunn diode resonator structure 34, 36 and 38, respectively for contact with and abutment against the respective Gunn diodes 28, 30 and 32 as is well known. The Gunn diode resonators 34, 36 and 38 are comprised of resonant disks 40, 42 and 44 and d.c. bias posts 48, 50 and 52 as is also well known. Channels 54, 56 and 58 are provided in the waveguide cap member 14 for receiving the bias posts 48, 50 and 52, respectively, and end in bias ports 60, 62 and 64, respectively, for providing d.c. power to the respective oscillators.

The present invention utilizes the fact that the oscillators of the invention appear as almost purely reactive impedances when no d.c. bias is applied thereto, i.e. when they are in the "off" condition. By proper positioning of these oscillators within the waveguide cavities 22, 24 and 26, the purely reactive impedances thereof are converted to "open circuits" at the center of waveguide manifold 20. Referring again to FIG. 2 it is seen that the reactive impedance of each of the oscillators is converted to an "open circuit" by positioning each oscillator 28, 30 and 32 at a distance of $3\lambda/4$ from the center of the main waveguide manifold 20 where $\lambda$ is the wavelength at the frequency f that is the average of all the center frequencies of the diode oscillators 28, 30 and 32. Further, each of the shunt waveguide cavities 22, 24 and 26 extends behind its respective diode oscillator for a distance $\lambda_o/2$ where $\lambda_o$ is the wavelength at the center frequency of each respective oscillator. Further, the main waveguide manifold 20 is terminated in a short circuit termination 64 as illustrated in FIGS. 1 and 2. Each oscillator 28, 30 and 32 is spaced in its respective shunt waveguide cavity at a distance of $m\lambda_o/4$ where m is an odd integer and $\lambda_o$ is the wavelength at the center frequency of each particular oscillator. By so positioning the oscillators 28, 30 and 32 with respect to the termination 64, the terminated section 64 appears as an open circuit at each junction of each oscillator with the central waveguide manifold 20 at the frequency of operation of that particular oscillator connected at that junction. The other end of the waveguide manifold 20 is the waveguide output port 66.

The multiple frequency oscillator 10 of the present invention is designed such that only one of the oscillators therein operates at any given time. When d.c. bias is applied to one of the oscillators to produce power at the desired frequency, the other oscillators and the short circuited end 64 of the waveguide manifold 20 appear as very high shunt reactances over a band of frequencies centered about the frequency f where f is the average of the center frequencies of all the oscillators in the device 10. These high shunt reactances do not greatly disturb the propagation of power from the active oscillator to the output, thus allowing several oscillators operating in a frequency band centered at frequency f to be connected to a single output port.

As examples of suitable operating frequencies, the three Gunn diodes 28, 30 and 32 and their associated radial resonators 34, 36 and 38 may operate at 88, 84 and 92 GHz, respectively. The oscillators may be mounted on alternate sides of the main waveguide manifold 20 as illustrated or they may be mounted on the same side.

Obviously many other modifications and variations of the present invention are possible in the light of the above teachings. It is therefore to be understood that within the scope of the appended claims the invention may be practiced otherwise than as specifically described.

What is claimed is:
1. A multiple frequency oscillator comprising:
   a waveguide housing having a waveguide cavity therein, said waveguide cavity comprising a main waveguide manifold cavity and n shunt waveguide cavities extending from said main waveguide manifold cavity; and
   n oscillators each having a different center frequency of oscillation and each being mounted within one of said n shunt waveguide cavities, each of said oscillators having an on and an off condition and each appearing as a highly reactive impedance when in said off condition, each of said n oscillators being so positioned within its respective said shunt waveguide cavity such that when each said oscillator is in said off condition, it appears as a substantially open circuit at the center of said main waveguide manifold cavity.

2. The oscillator of claim 1 wherein each of said n oscillators is positioned within its respective said shunt waveguide cavity at a distance of approximately $3\lambda/4$ from the center of said main waveguide manifold cavity where $\lambda$ is the wavelength at the average of the center frequencies of all of said n oscillators.

3. The oscillator of claim 2 wherein each of said n oscillators are Gunn diode oscillators.

4. The oscillator of claim 2 wherein said main waveguide manifold cavity includes a termination end and a radiating output port and wherein each of said n oscillators is located at a distance of $m\lambda_o/4$ from said termination end, where m is an odd integer and $\lambda_o$ is a wavelength at the center frequency of each said oscillator.

5. The oscillator of claim 1 wherein each of said n oscillators are Gunn diode oscillators.

6. The oscillator of claim 1 wherein $n=3$ and wherein the center frequencies of each of said three oscillators are 84 GHz, 88 GHz and 92 GHz, respectively.

7. The oscillator of claim 6 wherein two of said three oscillators are positioned on the same side of said main waveguide manifold cavity and the remaining one of said three oscillators is positioned on the opposite side of said main waveguide manifold cavity.

* * * * *